METHODS OF MANUFACTURE OF SEMICONDUCTOR ELEMENTS
AND ELEMENTS MANUFACTURED THEREBY
Filed June 27, 1969

United States Patent Office 3,611,554
Patented Oct. 12, 1971

3,611,554

METHODS OF MANUFACTURE OF SEMICONDUCTOR ELEMENTS AND ELEMENTS MANUFACTURED THEREBY

John Mansell Garrett, London, England, assignor to Westinghouse Brake English Electric Semi-Conductors Limited, London, England Filed June 27, 1969, Ser. No. 837,183
Claims priority, application Great Britain, Aug. 6, 1968, 37,377/68
Int. Cl. B01j *17/00;* H01l *5/00*
U.S. Cl. 29—580 19 Claims

ABSTRACT OF THE DISCLOSURE

A method of forming a semiconductor wafer from a slice of semiconductor material. Regions of one type of conductivity are formed on a semiconductor slice of the opposite type of conductivity extending inwardly from each of the opposed major faces of the slice thereby to form in the slice a pair of P-N junctions extending parallel to the major faces. Rigid metal members are then secured to the opposed major faces of the slice. Material is then mechanically removed from the peripheral portion of the slice to form a peripheral edge on which the P-N junctions emit and meet at an acute angle on that side of the P-N junction on which lies the original material of the slice. The peripheral edge meets the major faces adjacent the rigid metal members thus providing a protection for the circumferential edges of the wafer in its final form.

This invention relates to the manufacture of semiconductor elements of the type having a wafer of semiconductor material which wafer has opposed major faces extending inwardly of the wafer from each of which is an outer region of one type of conductivity and of relatively low resistivity each of which regions forms with an adjacent inner region of the opposite type of conductivity and of relatively high resistivity a P-N junction each of which junctions terminates in a peripheral face of the wafer which extends between the opposed major faces, the peripheral face being so inclined with respect of each P-N junction where it terminates in the peripheral face that it makes an acute angle with that junction on the side thereof of the region of relatively high resistivity. Semiconductor elements of this type will hereinafter be referred to "as of the type described."

The present invention provides a method of manufacture of semiconductor elements of the type described, which method includes providing a slice of semiconductor material having extending inwardly thereof from each of opposed major faces of the slice an outer region of one type of conductivity and of relatively low resistivity each of which regions forms with an adjacent inner region of the opposite type of conductivity and of relatively high resistivity a P-N junction extending in the same general direction as the respective major face, securing to each of the opposed major faces a member of rigid material, and subsequently removing material from the peripheral portion of the slice thereby to form the peripheral face of the resultant wafer which face, where it meets each of the major faces, does so at the respective member.

The slice may be formed with a lesser thickness between the central portions of the major faces than between the peripheral portions of the major faces.

The material of the peripheral portion of the slice may be removed by sand-blasting. Alternatively, it may be removed by abrading away the material with a tool of cross-section complementary to the required transverse cross-section of the peripheral face. This transverse cross-section may be part-circular and the tool may be a wire. The tool may itself be of abrasive material or it may itself be of non-abrasive material and may be fed with an abrasive slurry.

One of the members may constitute one of the contacts, which may be the anode contact, of the finished element and may extend over the whole of the respective major face.

One of the members may be a ring which, in the finished element, encircles another contact (which may be the cathode contact). In this case, the ring may subsequently be electrically connected externally of the wafer with said another contact and may be of aluminium, gold or an alloy of either of these or any one of these materials may be used as a solder to secure the ring to the slice, the ring then being, for example, of molybdenum.

The acute angle of the peripheral face to each junction where it terminates in the peripheral face, may be between 20° and 70° inclusive.

The wafer of the resultant element may be circular or of any other configuration in plan view.

The peripheral face of the wafer may be curved in its transverse cross-section or may be of some other configuration in that cross-section.

The present invention also provides semiconductor elements manufactured in accordance with any of the above specified methods.

One embodiment of the present invention will now be described in greater detail, by way of example only, with reference to the accompanying drawings of which:

Figure 1:
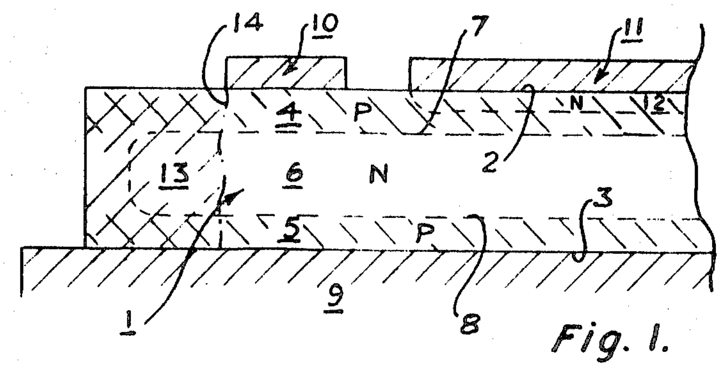
FIG. 1 shows one stage in the method of manufacture of the element.
Figure 2:
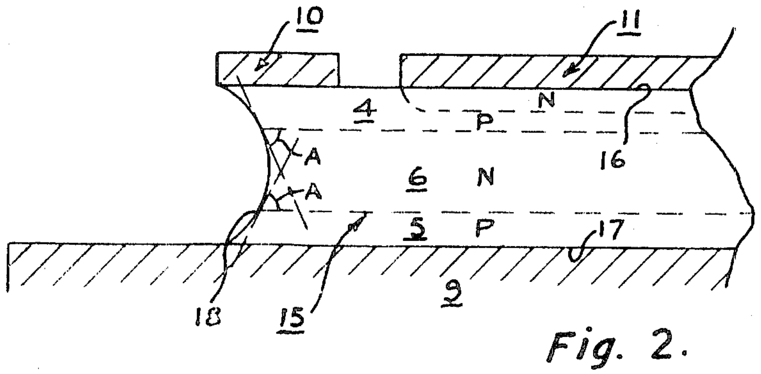
FIG. 2 shows a part cross-sectional view of the finished wafer.

In the method of which one stage is illustrated in FIG. 1, to form a semiconductor element as shown in FIG. 2, a slice 1 of semiconductor material of N-type conductivity and of relatively high resistivity had formed extending over the whole of its surface a "shell" of P-type conductivity and of relatively low resistivity. By this formation of the shell, the slice (which had opposed major faces 2 and 3) had extending inwardly of the slice, from the major face 2, the P-type conductivity region 4 and, from the major face 3, the P-type conductivity region 5. This "shell" of P-type conductivity formed with the N-type inner region 6 of the slice a P-N junction of which the planar portion 7 was provided between the region 4 and the region 6 of the slice and portion 8 was formed between the region 5 and the region 6 of the slice.

The slice 1 was then soldered by its major face 3 to a contact 9 on one side of the slice and to the opposed major face 2 was soldered by an aluminium-silicon eutectic solder, a ring 10 of molybdenum.

Alloyed also to the major face 2 was centrally-disposed further contact 11 by the alloying of which to the slice 1 the region 12 of the previously-formed region 4 was re-converted to N-type conductivity.

After the above described steps, the peripheral portion 13 of the slice 1 was removed by sand-blasting to leave a peripheral face of the configuration shown at 14.

After the above-mentioned steps, further material was removed from the peripheral portion of the thus-modified slice 1 by abrading-away material by lapping with a wire of circular-cross section fed with alumina slurry thus to convert the slice 1 into a wafer 15 (see FIG. 2) which had opposed major faces 16 and 17 between which extended the curved in cross-section peripheral face 18. In this resultant wafer, the P-type conductivity region 4 extended inwardly of the wafer 15 from the major face 16 and the P-type conductivity type 5 extended inwardly of the wafer 15 from the opposed major face 17.

At the periphery of both of the P-N junctions thus formed between the respective P-type conductivity 4 or 5 and the N-type conductivity region 6 they terminate on the peripheral face 18 of the wafer 15. The peripheral face 18 is, in each case, inclined at an acute angle A with respect to the P-N junction where it terminates in the peripheral face 18 on that side (the N-type conductivity side) thereof where the resistivity of the semiconductor material is relatively high (i.e. it is high relative to the lower resistivity of the P-type conductivity region 4 or 5 respectively).

Conveniently, the slice 1 and the resultant wafer 15 may be of circular plan view.

In the elements specifically described above, it is a P-N-P-N device of which the contact 9 constitutes the anode, the contact 11 constitutes the cathode and the ring 10 constitutes an ohmic contact to the P-type region 4, which may, subsequently, be electrically connected externally of the wafer 15 with the cathode contact 11.

Figure 3:
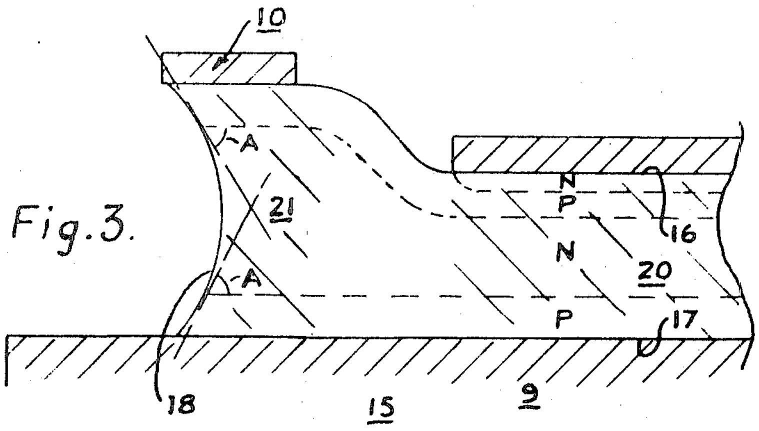
FIG. 3 shows a part cross-sectional view of an alternative form of finished wafer.

In order to provide the maximum thickness of the wafer 15 at the periphery thereof, the wafer 15 may have a cross-sectional configuration as shown in FIG. 3. That is to say, the slice (and the wafer 15 subsequently formed therefrom) may be formed with a lesser thickness adjacent the central portions of the major faces 16 and 17 than it has at 21 adjacent the peripheral portions of these faces.

It will be seen that in the wafer 15 of both FIG. 2 and FIG. 3 that the peripheral face 18 of the wafer 15 where it meets both the major face 16 and the major face 17 does so adjacent, respectively, the contact 9 and the ring 10. Thus, the contact 9 and the ring 10 form a support for the fragile extreme peripheral regions of the major faces 16 and 17.

The removal of peripheral material from the slice 1 to form the peripheral face 18 of the resultant wafers 15 is stated as having been removed by the use of a wire of circular cross section fed with an alumina slurry. This material may be removed by other ways as, for example, by sand-blasting.

Again, the peripheral face 18 of the wafer 15 has been shown as being of part-circular section (having been formed by lapping with a wire of circular cross-section but other transverse cross-sectional configurations can be used the important point being that, whatever may be the configuration, the peripheral face 18 where the P-N junctions terminate making with those junctions on the relatively high resistivity side, and acute angle.

The acute angle may be any angle between 20° and 70° inclusive.

Having thus described our invention what we claim is:

1. A method of manufacture of semiconductor wafer elements comprising forming, in a semiconductor slice of one type of conductivity, regions of the opposite type of conductivity extending inwardly thereof from each of the opposed major faces of the slice to form a pair of P-N junctions extending generally parallel to the major faces, the outer regions being of one type of conductivity and of relatively low resistivity, the adjacent inner region being of the opposite type of conductivity and of relatively high resistivity, securing to each of the opposed major faces a member of rigid metallic material, and subsequently mechanically removing material from the peripheral portion of the slice thereby to form the peripheral face of the resultant semiconductor wafer element, said material being removed such that the P-N junctions terminate at said face at an acute angle on that side of the P-N junction on which lies the original material of the slice and such that said peripheral face meets said major faces adjacent the respective rigid metallic faces to protect the peripheral face of the wafer in its final form.

2. A method as claimed in claim 1, wherein the slice is formed with a lesser thickness between the central portions of the major faces than between the peripheral portions of the major faces.

3. A method as claimed in claim 1, wherein the material of the peripheral portion of the slice is removed by sand-blasting.

4. A method as claimed in claim 1, wherein the material of the peripheral portion of the slice is removed by abrading away the material with a tool of cross-section complementary to the required transverse cross-section of the peripheral face.

5. A method as claimed in claim 4, wherein the transverse cross-section is part-circular.

6. A method as claimed in claim 5, wherein the tool is a wire.

7. A method as claimed in claim 4, wherein the tool is itself of abrasive material.

8. A method as claimed in claim 4, wherein the tool is itself of non-abrasive material and is fed with an abrasive slurry.

9. A method as claimed in claim 1, wherein one of the members of rigid metallic material constitutes, in the finished element, an anode contact.

10. A method as claimed in claim 9, wherein said one of the members extends over the whole of the respective major face.

11. A method as claimed in claim 1, wherein one of the members of rigid metallic material is a ring which, in the finished element, encircles a contact of the element.

12. A method as claimed in claim 11, wherein the contact constitutes the cathode contact of the element.

13. A method as claimed in claim 11, wherein the ring is subsequently electrically connected externally of the wafer with said contact.

14. A method as claimed in claim 11, wherein the ring is of aluminium, gold or an alloy of either of these.

15. A method as claimed in claim 11, wherein the ring is of metallic material and is soldered to the slice by a solder constituted or containing aluminium, gold or an alloy of either of these.

16. A method as claimed in claim 1, wherein said acute angle is between 20° and 70° inclusive.

17. A method as claimed in claim 1, wherein the wafer of the resultant element is of circular plan view.

18. A method as claimed in claim 1, wherein the peripheral face of the wafer is curved in its transverse cross-section.

19. A method as claimed in claim 1, wherein said one type of semiconductor material is of relatively high resistivity and said regions of the opposite type of conductivity are of relatively low resistivity.

References Cited

UNITED STATES PATENTS

| | | | |
|---|---|---|---|
| 2,854,366 | 9/1958 | Wannlund et al. | 29—580 UX |
| 2,886,026 | 5/1959 | Stewart | 29—583 X |
| 2,886,748 | 5/1959 | Barton | 29—583 X |
| 3,288,662 | 11/1966 | Weisberg | 29—590 UX |
| 3,307,240 | 3/1967 | Ginsbach et al. | 29—590 X |
| 3,326,071 | 6/1967 | Bushman et al. | 83—7 |
| 3,437,886 | 4/1969 | Edqvist et al. | 317—235 X |

JOHN F. CAMPBELL, Primary Examiner

W. TUPMAN, Assistant Examiner

U.S. Cl. X.R.

29—590; 317—235